Dec. 9, 1958

E. KEONJIAN 2,863,955

DIRECT-COUPLED AMPLIFIERS

Filed March 9, 1953

Inventor:
Edward Keonjian,
by Charles M. Hutchins
His Attorney.

United States Patent Office 2,863,955

Patented Dec. 9, 1958

2,863,955

DIRECT-COUPLED AMPLIFIERS

Edward Keonjian, Syracuse, N. Y., assignor to General Electric Company, a corporation of New York Application March 9, 1953, Serial No. 341,017

2 Claims. (Cl. 179—171)

My invention relates to direct-coupled amplifiers and more particularly, to means for stabilizing direct-coupled transistor amplifiers.

The present invention represents an improvement over the invention disclosed and claimed in my copending application Serial No 329,965, filed January 7, 1953, and assigned to the assignee of this application.

It is a principal object of my invention to provide means for rendering the output of a semiconductor amplifier relatively insensitive to ambient temperature variations.

Another object of my invention is to provide a direct-coupled transistor amplifier in which a high degree of stabilization of the operating point is achieved with relatively little loss in amplifier gain.

The objects of my invention may be realized through the provision of means for controlling the relative magnitudes of the components of current flowing in the output circuit of a direct-coupled transistor amplifier so that any change in one component caused by a change in temperature is compensated by an equal and opposite change in another component.

In accordance with a feature of my invention the transistors of my amplifier circuit may be selected so that the individual characteristics thereof control the relative magnitudes of the components of the output current of the amplifier circuit, so that any change in one component of output current caused by a temperature variation is compensated by an equal and opposite change in another component of output current, thereby stabilizing the output of the amplifier with respect to temperature variations.

The features of my invention which I believe to be novel are set forth with particularity in the appended claims. My invention itself, however, both as to its organization and method of operation, together with further objects and advantages thereof, may best be understood by reference to the following description taken in connection with the accompanying drawing in which:

Figure 1:
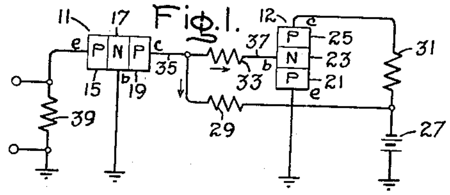
Fig. 1 is a schematic circuit diagram of a direct-coupled transistor amplifier embodying the novel features of my invention.

Fig. 1 shows a single-ended two-stage amplifier comprising a pair of transistors 11 and 12 which may be of the type commonly designated P–N–P junction transistors consisting, as is known, of an arrangement of two P–N junctions (not shown) arranged back-to-back in a single crystal of germanium thus providing two P-type zones separated by an N-type zone. Separate electrical connections are made to each zone thereby providing the usual emitter, base, and collector electrodes 15, 17, and 19, respectively, for the transistor 11 and similar electrodes 21, 23 and 25, respectively, for the transistor 12.

It will be clearly understood, however, that N–P–N junction transistors can be used if desired, necessitating only a reversal of the terminals of the bias voltage sources employed. This is so because N–P–N junction transistors operate similarly to the P–N–P type, each type being characterized in that each exhibits a collector-current versus collector-voltage family of curves consisting essentially of parallel lines of substantially uniform spacing.

The electrodes of the transistors 11 and 12 are biased by a source of direct voltage, as by a battery 27, which causes current flow thereamong. The positive terminal of the battery 27 is grounded and the negative terminal thereof is connected through a load resistor 29 for the transistor 11 to the collector 19 thereof and through an output load resistor 31 to the collector 25 of the transistor 12.

In the circuit arrangement shown in Fig. 1, a signal to be amplified is applied from a source (not shown) across an input resistor 39 and is fed to the emitter electrode 15 of the transistor 11.

The emitter electrode 15 of the transistor 11 is thus used as an input electrode, the collector 19 thereof is used as an output electrode, and the base 17 is employed as a common electrode. Base 23 of the transistor 12 is used as the input electrode, emitter 21 being used as the common electrode, and the collector 25 being employed as the output electrode. This type of transistor circuit arrangement is termed a "grounded-base, grounded-emitter" amplifier circuit, and although the following description pertains thereto, it will be clearly understood that other arrangements are well-known in the art and my invention is not limited in scope to the arrangements here shown. For example, the transistors 11 and 12 can be connected as a grounded-emitter, grounded-emitter amplifier.

For stabilizing the transistor amplifier circuit in accordance with my invention, a resistor 33 of preselected magnitude is coupled between the collector 19 of the transistor 11 and the base 23 of the transistor 12 by conductors 35 and 37 respectively. The conductors 35 and 37 and the resistor 33 provide a conductive path between the output electrode 19 of the transistor 11 and the input electrode 23 of the transistor 12 thereby directly coupling the transistors and rendering the passage of low frequency and unidirectional signals therethrough possible.

Figure 2:
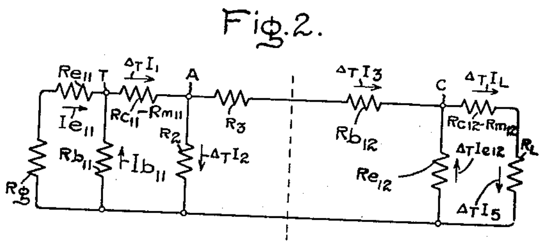
Fig. 2 is an equivalent circuit diagram of the amplifier illustrated in Fig. 1.

The effect of the resistor 33 in the amplifier circuit can best be understood by reference to Fig. 2 which is an equivalent circuit diagram of the amplifier illustrated in Fig. 1. The equivalent-circuit representation of the transistor 11 connected as a grounded-base stage comprises an emitter resistance $Re_{11}$, a base resistance $Rb_{11}$, and a collector resistance $Rc_{11}$. The equivalent circuit representation of the transistor 12 connected as a grounded-emitter stage includes a base resistance $Rb_{12}$ and an emitter resistance $Re_{12}$, and a resistance $Rcm_{12}$ in the collector branch of the transistor 12 that is equal to $Rc_{12}-Rm_{12}$ where $Rm_{12}$ is a fictitious resistance that denotes the fact that an electromotive force is generated in the collector branch of the transistor 12 having a value substantially proportional to the emitter current. The constant of proportionality has the dimensions of impedance and is symbolized by $Rm_{12}$. The value of $Rm_{12}$ is determined by the equation $Rm_{12}=Ryx-Rxy$, where $R_{xy}$ is the ratio of the signal voltage appearing between the emitter and the base to the signal current flowing in the collector circuit when the emitter circuit is effectively open, and $R_{yx}$ is the ratio of the signal voltage appearing between the collector and the base to the signal current flowing in the emitter circuit when the collector circuit is effectively open.

A resistance $R_g$ corresponds to the input resistor 39 connected to the emitter 15 of the transistor 11 in Fig. 1. The directions of the currents are assumed as indicated by the arrows in Fig. 2, the current arrows being identified by appropriate subscripts to the symbol $\Delta_T I$ which represents an incremental current caused by a variation in temperature.

In the analysis that follows, it is assumed: (1) the voltage between the collector and the base, $V_{cb}$, is maintained constant within a range where it negligibly affects the collector current, $I_c$; (2) the current amplification factor $\alpha$ is constant over the operating range, $\alpha$ being defined as the rate of change of the collector current with respect to the emitter current with the collector-base voltage, $V_{cb}$, held constant; and (3) the voltage between the emitter and the base is zero.

Further referring to Fig. 2, the current $\Delta_T I_3$, which represents the incremental current caused by variation in temperature flowing through resistance 33 and into the base of transistor 12, may be expressed in terms of $\Delta_T I_2$, which represents the incremental current caused by a variation in temperature flowing through resistance 29, by the use of the relationship existing among the total current and the current in one of two parallel branches and is as follow:

$$\Delta_T I_3 = \frac{R_2}{R_1} \Delta_T I_2 \quad (1)$$

where:

$$R_1 = R_3 + Ri_{12} \quad (2)$$

and $Ri_{12}$ is the input resistance of the transistor 12 and defined by:

$$Ri_{12} = Rb_{12} + \frac{(Rc_{12} - Rm_{12} + R_L)(Re_{12})}{Rc_{12} - Rm_{12} + R_L + Rc_{12}} \quad (3)$$

where $R_L$ is the load resistance corresponding to resistance 31.

In the transistor 12, which, as noted, is a grounded emitter stage, the current relation at the point C, assuming the total incremental load current to be $\Delta_T I_L$, may be expressed as follows:

$$\Delta_T I_L = \Delta_T I_3 + \Delta_T Ie_{12} \quad (4)$$

where $\Delta_T Ie_{12}$ is the incremental emitter current flowing in transistor 12.

As is well-known from junction transistor theory, the basic relationship among the transistor electrode currents is expressed by:

$$\Delta_T I_L = \alpha_{12} \Delta_T Ie_{12} + \Delta_T Ico_{12} \quad (5)$$

where $\alpha_{12}$ is the amplification factor of transistor 12 and $\Delta_T Ico_{12}$ is the incremental change in back collector current caused by a variation in temperature.

Solving (5) for $\Delta_T Ie_{12}$ $$\Delta_T Ie_{12} = \frac{\Delta_T I_L - \Delta_T Ico_{12}}{\alpha_{12}} \quad (6)$$

Substituting (6) in (4) and solving for $\Delta_T I_L$:

$$\Delta_T I_L = \frac{-\alpha_{12}}{1-\alpha_{12}} \Delta_T I_3 + \frac{\Delta_T Ico_{12}}{1-\alpha_{12}} \quad (7)$$

Letting $$B_{12} = \frac{\alpha_{12}}{1-\alpha_{12}} \quad (8)$$

then:

$$\Delta_T I_L = -B_{12} \Delta_T I_3 + \Delta_T Ico_{12}(B_{12}+1) \quad (9)$$

From Equation 8 it can be seen that $B_{12}$ represents the current amplification of the transistor 12 connected as a grounded emitter stage. From Equation 9 it can be seen that the load current, $\Delta_T I_L$ consists of two components currents that flow in opposite directions, namely, a component $-B_{12}\Delta_T I_3$ and a component $$\Delta_T Ico_{12}(B_{12}+1)$$

Thus the input current to transistor 12, $\Delta_T I_3$, is amplified by a factor $B_{12}$ and is reversed in phase as it passes through the transistor 12. Because of this reversal of phase it is opposite in direction to the component of load current, $\Delta_T Ico_{12}(B_{12}+1)$.

For temperature compensation of the output current of the transistor 12 and thus the entire amplifier, any change in the magnitude of one component of current caused by a temperature variation must be equal in magnitude and opposite in direction to a change in the other component of current caused by a temperature variation. Because these output current components are flowing in opposite directions, the direction of the change caused by a temperature variation must be the same for both currents.

Let $$+B_{12}\Delta_T I_3 = \Delta_T I_4 \quad (10)$$

$$\Delta_T Ico_{12}(B_{12}+1) = \Delta_T I_5 \quad (11)$$

The condition for temperature compensation as discussed above may be expressed as follows:

$$\Delta_T I_4 = \Delta_T I_5 \quad (12)$$

Substituting (1), (10), and (11) in (12) we have:

$$\Delta_T I_1\left(\frac{R_2}{R_1+R_2}\right) = \Delta_T Ico_{12}\left(\frac{B_{12}+1}{B_{12}}\right) \quad (13)$$

To express $\Delta_T Ico_{12}$ in terms of $\Delta_T Ico_{11}$, the diode back current of the transistor 11, the current relation at point T (Fig. 2) is written as follows:

$$\Delta_T I_1 = \Delta_T Ie_{11} + \Delta_T Ib_{11} \quad (14)$$

But as is well-known from junction transistor theory:

$$\Delta_T I_1 = \alpha_{11}\Delta_T Ie_{11} + \Delta_T Ico_{11} \quad (15)$$

or substituting (14) in (15)

$$\Delta_T Ie_{11} \Delta_T Ib_{11} = \alpha_{11}\Delta_T Ie_{11} + \Delta_T Ico_{11} \quad (16)$$

The voltage equation for the input loop of the transistor 11 is:

$$\Delta_T Ie_{11}(Rg + Re_{11}) = \Delta_T Ib_{11} Rb_{11} \quad (17)$$

Solving for $\Delta_T Ib_{11}$:

$$\Delta_T Ib_{11} = \Delta_T Ie_{11} \frac{(Rg + Re_{11})}{Rb_{11}} \quad (18)$$

Substituting (18) in (16) and collecting terms:

$$\Delta_T Ie_{11} \frac{\Delta_T Ico_{11}}{\frac{Re_{11}+Rg}{Rb_{11}} + 1 - \alpha_{11}} \quad (20)$$

Substituting (20) in (15) and collecting terms:

$$\Delta_T I_1 = \Delta_T Ico_{11}\left(\frac{Rb_{11}+Re_{11}+Rg}{Re_{11}+Rg+Rb_{11}}(1-\alpha)\right) \quad (21)$$

Let $$S_{11} = \frac{Rb_{11}+Re_{11}+Rg}{Re_{11}+Rg+Rb(1-\alpha_{11})} \quad (22)$$

where S is the stability factor of a transistor.

Therefore:

$$\Delta_T I_1 = S_{11}\Delta_T Ico_{11} \quad (23)$$

Substituting (2) and (23) in (13) and assuming that $$\frac{B_{12}+1}{B_{12}}$$

is approximately 1:

$$\frac{R_2}{R_2+R_3+R_{i12}} = \frac{\Delta_T Ico_{12}}{S_{11}\Delta_T Ico_{11}} \quad (24)$$

Equation 24 gives the relation of circuit parameters that must exist for temperature stabilization. For any pair of transistors the values of $Ri_{12}$, $Ico_{11}$, $S_{11}$, and $Ico_{12}$ are fixed and therefore the necessary relation of $R_3$ to $R_2$ can be determined from Equation 24 so that the amplifier circuit is insensitive to temperature variations.

Summarizing, it can be seen that the current increment caused by a temperature variation and appearing at the collector of the transistor 11, $\Delta_T I_1$, is divided at junction A into two currents, $\Delta_T I_2$ and $\Delta_T I_3$, the former flowing through $R_2$ and the latter flowing through $R_3$. A current $\Delta_T I_4$, caused by current $\Delta_T I_3$, appears in the collector branch of the transistor 12. This $\Delta_T I_4$ current is opposed in direction relative to $\Delta_T I_3$. The relation between $R_2$ and $R_3$ is so chosen that the temperature caused-current increment $\Delta_T I_4$ is equal to the temperature-caused current increment $\Delta_T I_5$.

Figure 3:
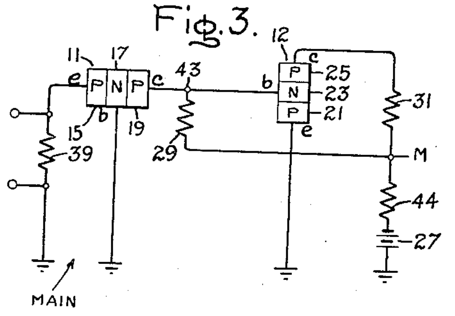
Fig. 3 is a schematic circuit diagram illustrative of a modified form of the amplifier shown in Fig. 1.

The circuit arrangement shown in Fig. 3 is a modification of the circuit illustrated in Fig. 1. In this modification, circuit elements similar to those of the embodiment of Fig. 1 are identified by similar reference characters. The transistors 11 and 12 are directly coupled as by a conductor 43 extending between the collector electrode 19 of the transistor 11 and the base electrode 23 of the transistor 12. To stabilize the amplifier circuit in accordance with the present invention, a resistor 44 of preselected magnitude is connected between the ungrounded terminal of the battery 27 and a point M at the junction of the load resistor 29 of the transistor 11 and the resistor 31.

Figure 4:
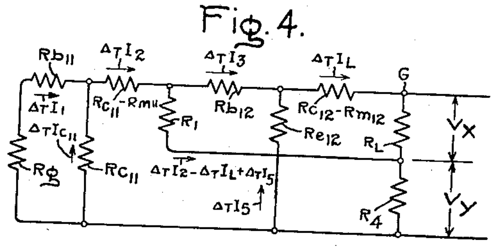
Fig. 4 is an equivalent circuit diagram of the amplifier illustrated in Fig. 2.

The effect of the resistor 44 in the amplifier circuit can best be understood by reference to Fig. 4, which is an equivalent circuit diagram of the amplifier illustrated in Fig. 3.

The assumptions made in the foregoing discussion relating to the circuit of Fig. 1, are effective in the following discussion. The transistors 11 and 12 are represented, as in Fig. 1, by the resistances $Rb_{11}$, $R\epsilon_{11}$ and $Rc_{11}$—$Rm_{11}$ for transistor 11; and $Rb_{12}$, $R\epsilon_{12}$ and $Rc_{12}$—$Rm_{12}$ for transistor 12. Resistances $R_g$, $R_1$, $R_L$, and $R_4$ represent resistors 39, 29, 31 and 44 respectively, and the current arrows are identified by appropriate subscripts to the symbol $\Delta_T I$, which, as before, represents an incremental current caused by a variation in temperature.

Rewriting Equation 5 as Equation 25:

$$\Delta_T I_L = \alpha_{12}\Delta_T I_5 + \Delta_T Ico_{12} \qquad (25)$$

A Kirchhoff voltage equation of Fig. 4 is as follows neglecting the voltage drop arising in $Rb_{12}$:

$$R_1(\Delta_T I_2 - \Delta_T I_L + \Delta_T I_5) + R_4(\Delta_T I_2 + \Delta_T I_5) + R\epsilon_{12}\Delta_T I_5 = 0 \qquad (26)$$

Collecting terms and substituting (25) in (26), we have:

$$\Delta_T I_2(R_1+R_4) - (\alpha_{12}\Delta_T I_5 + \Delta_T Ico_{12})R_1 + \Delta_T I_5(R_1 + R\epsilon_{12} + R_4) = 0 \qquad (27)$$

Solving Equation 27 for $\Delta_T I_5$:

$$\Delta_T I_5 = \frac{\Delta_T Ico_{12}R_1 - S\Delta_T Ico_{11}(R_1+R_4)}{R_1(1-\alpha_{12}) + R\epsilon_{12} + R_4} \qquad (28)$$

where "S" is as defined by Equation 22.

The change in output voltage caused by a change in temperature $\Delta_T V_T$ is equal to the voltage across the total load resistance of $R_L + R_4$ or:

$$\Delta_T V_T = (\Delta_T I_2 + \Delta_T I_5)R_4 + \Delta_T I_L R_L \qquad (29)$$

From Equation 23:

$$\Delta_T I_2 = S_{11} Ico_{11} \qquad (30)$$

Substituting (25), (27), and (30) in (29) and rearranging terms:

$$\Delta_T V_T = S_{11}\Delta_T Ico_{11}\left(\frac{-\alpha_{12}R_1R_4 + R\epsilon_{12}R_4}{R_1(1-\alpha_{12}) + R\epsilon_{12} + R_4} - \alpha_{12}R_L(R_1+R_4)\right) + \Delta_T Ico_{12}\left(\frac{R_L(R_1 + R\epsilon_{12} + R_4) + R_1R_4}{R_1(1-\alpha_{12}) + R\epsilon_{12} + R_4}\right) \qquad (31)$$

For stabilization of the output, i. e., for rendering the output of the amplifier insensitive to temperature variations, the change in load voltage caused by a change in temperature must be equal to zero. Expressed algebraically, for stabilization:

$$\Delta_T V_T = 0 \qquad (32)$$

Substituting (32) in (31) and solving:

$$S_{11}\Delta_T Ico_{11}\left(\alpha_{12} + \frac{R_4(\alpha_{12}R_L - R\epsilon_{12})}{(R_1(R_4+R_L)}\right) = \Delta_T Ico_{12}\left(1 + \frac{R_L(R\epsilon_{12}+R_4)}{R_1(R_L+R_4)}\right) \qquad (33)$$

Equation 33 gives the relationship among the circuit parameters that must exist for temperature stabilization. For any given pair of transistors 11 and 12 the values of the resistors $R_1$, $R_4$, and $R_L$, can be chosen so that stabilization is effected, that is, the values of $R_1$, $R_4$, and $R_L$ are chosen so that the output of the amplifier does not vary with a change in temperature.

Figure 5:
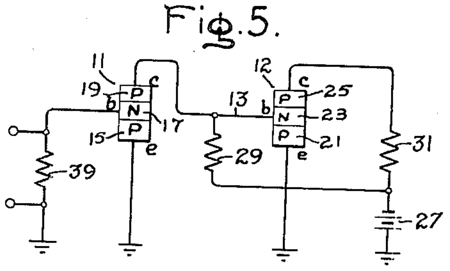
Fig. 5 is a circuit diagram of a further modification of the direct-coupled transistor amplifier of the present invention.

Figure 5 illustrates another modification of my stabilized direct-coupled transistor amplifier, in which elements corresponding to those described in connection with the circuits of Figs. 1 and 3 are identified by corresponding reference numerals.

The transistors 11 and 12 are conductively coupled connecting the collector electrode 19 of the transistor 11 to the base electrode 23 of the transistor 12. Resistors 29 and 31 are employed as the load resistances for the transistors 11 and 12 respectively, and resistor 39 is utilized as an input resistor. However, in accordance with the present invention, the transistors 11 and 12 are selected so that the exact relation of the characteristics of the transistors 11 and 12 are such that temperature stabilization is effected. The criteria for the selection of such transistors are derived hereinbelow.

Figure 6:
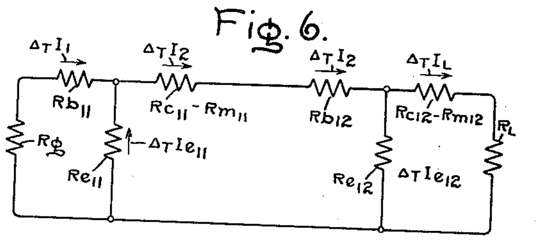
Fig. 6 is an equivalent circuit diagram of the amplifier illustrated in Fig. 5.

In Fig. 6 the equivalent circuit diagram of Fig. 5, resistances $R\epsilon_{11}$, $Rb_{11}$, and $Rc_{11}$—$Rm_{11}$ represent transistor 11 and $R\epsilon_{12}$, $Rb_{12}$ and $Rc_{12}$—$Rm_{12}$ represent transistor 12. Resistance 29 is not shown in the equivalent circuit diagram of Fig. 5 since it is large enough with respect to the input resistance of transistor 12 to permit it to be neglected in the subsequent analysis.

The load current increment $\Delta_T I_L$ employing the methods described above, can be expressed as follows:

$$\Delta_T I_L = -B_{12}\Delta_T I_2 + \Delta_T Ico_{12}(B_{12}+1) \qquad (34)$$

The current $\Delta_T I_2$ from Equation 15 is:

$$\Delta_T I_2 = -B_{11}\Delta_T I_L + \Delta_T Ico_{11}(B_{11}+) \qquad (35)$$

Substituting (35) in (34) and neglecting the current flowing into resistance 29 we have:

$$\Delta_T I_L = B_{11}B_{12}\Delta_T I_1 - (B_{11}+1)B_{12}\Delta_T Ico_{11} + \Delta_T Ico_{12}(B_{12}+1) \qquad (36)$$

For temperature stabilization the load current increment for a change in temperature must equal zero or:

$$\Delta_T I_L = 0 \qquad (37)$$

Substituting (37) in (36) which has been further simplified by use of the current relation between $\Delta_T I_1$ and $\Delta_T Ie_{11}$ as a function of $Rb_{11}$, $Re_{11}$ and $Rg$, and subsequently assuming that $Re_{11}$ may be neglected in the S factor defined by these resistances by choosing a high source impedance ($Rg$), we have:

$$(B_{11}+1)B_{12}\Delta_T Ico_{11} = +(B_{12}+1)\Delta_T Ico_{12} \qquad (38)$$

Now, if the transistor 12 is selected with the highest $\alpha$ then:

$$B_{12} >> 1$$

and $$\Delta_T Ico_{12} = \Delta_T Ico_{11}(B_{11}+1) \qquad (39)$$

Equation 39 gives the approximate condition for stabilization while Equation 38 gives the exact condition for stabilization. From Equation 38 it can be seen that a pair of transistors 11 and 12 can be selected so that the values of $\Delta_T Ico_{11}$ and $\Delta_T Ico_{12}$ satisfy Equation 38 for a restricted region of temperature variation. In general, this selection will require the use of a semiconductor amplifier device with a relatively small value of $\Delta_T Ico$ in the first stage, and a semiconductive amplifier device with a relatively large value of $\Delta_T Ico$ in the second stage.

Figure 7:
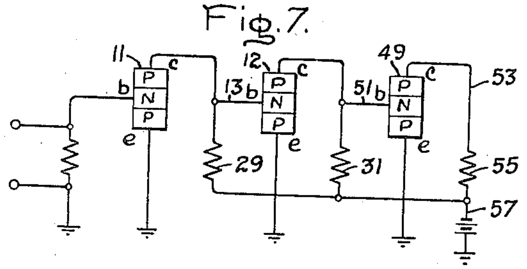
Fig. 7 is a schematic circuit diagram of a three-stage amplifier each stage of which is similar to a stage of the amplifier shown in Fig. 5.

The circuit arrangement shown in Fig. 7 is a three-stage amplifier each stage of which is similar to a stage of the amplifier shown in Fig. 5. A transistor 49 is connected to the resistor 31 by a conductor 51 and gives additional amplification to the input signal. The output from transistor 49 is fed through a conductor 53 to a load resistor 55. Bias for the output electrode of transistor 49 is supplied from the battery 27, through a conductor 57, resistor 55, and conductor 53.

Figure 8:
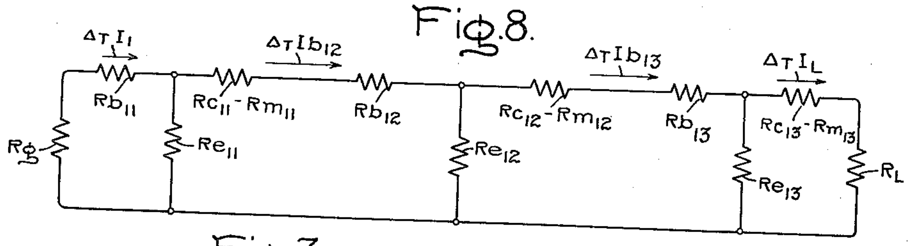
Fig. 8 is an equivalent circuit diagram of the amplifier shown in Fig. 7.

Fig. 8 is an equivalent circuit diagram corresponding to three grounded-emitter stages connected in cascade as shown in Fig. 7, and shows the application of the foregoing analysis to a three-stage direct-coupled semiconductive amplifier.

Rewriting Equation 35 as Equation 40:

$$\Delta_T Ib_{12} = -B_{11}\Delta_T I_1 + \Delta_T Ico_{11}(B_{11}+1) \qquad (40)$$

and the current $\Delta_T Ib_{13}$ is, from Equation 34, $$\Delta_T Ib_{13} = -B_{12}\Delta_T Ib_{12} + \Delta_T Ico_{12}(B_{12}+1) \qquad (41)$$

Substituting (40) in (41):

$$\Delta_T Ib_{13} = B_{11}B_{12}\Delta_T I_1 - (B_{11}+1)B_{12}\Delta_T Ico_{11} + \Delta_T Ico_{12}(B_{12}+1) \qquad (42)$$

The load current $\Delta_T I_L$ is given by $$\Delta_T I_L = -B_{13}\Delta_T Ib_{13} + \Delta_T Ico_{13}(B_{13}+1) \qquad (43)$$

Substituting (42) in (43):

$$\Delta_T I_L = -B_{11}B_{12}B_{13}\Delta_T I_1 + (B_{11}+1)B_{12}B_{13}\Delta_T Ico_{11} - \Delta_T Ico_{12}(B_{12}+1)B_{13} + \Delta_T Ico_{13}(B_{13}+1) \qquad (44)$$

To make the incremental change in load current caused by a temperature variation, $\Delta_T I_L$ equal to zero the right side of Equation 44 must equal zero and eliminating the $\Delta_T I_1$ term by the same manner as before, or:

$$(B_{11}+1)B_{12}B_{13}\Delta_T Ico_{11} + \Delta_T Ico_{13}(B_{13}+1) = \Delta_T Ico_{12}B_{13}(B_{12}+1) \qquad (45)$$

neglecting the term expressing the effect of temperature on $I_1$.

Or assuming $B_{13}$ and $B_{12}$ are each very large as compared to unity the condition for stabilization becomes:

$$(B_{11}+1)B_{12}\Delta_T Ico_{11} + \Delta_T Ico_{13} = \Delta_T Ico_{12}B_{12} \qquad (46)$$

In Equation 46, all the factors are dependent on the properties of transistors 11, 12 and 13. Thus these transistors must be carefully selected so that their diode back currents and current amplification factors meet the criteria for stabilization established in Equation 46.

Although my invention has been described in connection with specific embodiments, many modifications thereof may be made without departing from the spirit and scope of the invention.

What I claim as new and desire to secure by Letters Patent of the United States is:

1. A direct-coupled semiconductor amplifier comprising first and second junction semiconductor devices each having base, emitter, and collector electrodes, the back collector current of said devices varying with ambient temperature, thus normally causing changes in the output current thereof an input resistor connected between the emitter electrode of said first device and ground, means connecting the base electrode of said first device to ground, means for conductively connecting the collector electrode of said first device and the base electrode of said second device, a source of direct voltage for establishing current flow among the electrodes of said devices and having grounded and ungrounded terminals, means for connecting the emitter electrode of said second device to ground, a first and second load resistor, and a current distributing resistor, said first load resistor for said first device being connected between the collector electrode of said first device and one terminal of said second load resistor, said second load resistor having its other terminal connected to the collector electrode of said second device, and said current-distributing resistor having one terminal connected to the joined terminals of said load resistors and having its other terminal connected to said ungrounded terminal of said source of direct voltage said resistors being proportioned to cause the portion of the temperature induced changes in output current of said first device fed to the base electrode of said second device to substantially offset the changes in output current of said second device.

2. The semiconductor amplifier defined in claim 1 wherein the relative magnitudes of said resistors are determined by the relation:

$$S_{11}\Delta_T Ico_{11}\left(\alpha_{12} + \frac{R_4(\alpha_{12}R_L - R\epsilon_{12})}{R_1(R_4+R_L)}\right) = \Delta_T Ico_{12}\left(1 + \frac{R_L(R\epsilon_{12}+R_4)}{R_1(R_L+R_4)}\right)$$

where: $S_{11}$ is the stabilization factor of said first device, $\Delta_T Ico_{11}$ and $\Delta_T Ico_{12}$ are the changes in diode back current of said first and second devices respectively that are caused by a change in temperature variation, $\alpha_{12}$ is the current amplification factor of said second device, $R\epsilon_{12}$ is the emitter resistance of said second device, and $R_1$, $R_L$ and $R_4$ represent the resistance of said load resistance, said output load resistor, and said current-distributing resistor respectively.

References Cited in the file of this patent

UNITED STATES PATENTS

| | | |
|---|---|---|
| 2,647,958 | Barney | Aug. 4, 1953 |
| 2,663,806 | Darlington | Dec. 22, 1953 |
| 2,666,817 | Raisbeck et al. | Jan. 19, 1954 |

FOREIGN PATENTS

| | | |
|---|---|---|
| 665,867 | Great Britain | Jan. 30, 1952 |
| 140,501 | Sweden | May 26, 1953 |

OTHER REFERENCES

Bell Text, "The Transistor," pages 153–155, pub. 1951 by Bell Tel. Labs., Murray Hill, N. J. (Copy in Div. 69.)

Bell text of record add pages 188, 346–347, 372.

Bell text of record add pages 183–188.